United States Patent [19]

Reinschmidt et al.

[11] Patent Number: 5,301,163
[45] Date of Patent: Apr. 5, 1994

[54] MEMORY SELECTION/DESELECTION CIRCUITRY HAVING A WORDLINE DISCHARGE CIRCUIT

[75] Inventors: Robert M. Reinschmidt, Los Gatos; Steven C. Sullivan, Campbell, both of Calif.

[73] Assignee: Digital Equipment Corp., Maynard, Mass.

[21] Appl. No.: 830,768

[22] Filed: Feb. 3, 1992

Related U.S. Application Data

[63] Continuation of Ser. No. 531,385, May 31, 1990, abandoned.

[51] Int. Cl.$^5$ .................... G11C 7/00; G11C 8/00
[52] U.S. Cl. ..................... 365/230.06; 365/189.11; 365/204; 365/225.6
[58] Field of Search ............. 307/449, 463, 466, 467; 365/189.11, 190, 204, 225.6, 230.06

[56] References Cited

U.S. PATENT DOCUMENTS

| | | | |
|---|---|---|---|
| 4,348,747 | 10/1982 | Takahashi | 365/190 |
| 4,357,687 | 11/1982 | Rufford | 365/225.6 |
| 4,370,736 | 1/1983 | Takahashi | 365/155 |
| 4,394,657 | 7/1983 | Isogai et al. | 307/463 |
| 4,477,885 | 10/1984 | Sharp | 365/204 |
| 4,500,799 | 2/1985 | Sud et al. | 307/449 |
| 4,520,462 | 5/1985 | Yamada et al. | 365/204 |
| 4,578,779 | 3/1986 | Chan et al. | 365/190 |
| 4,611,303 | 9/1986 | Kitano | 365/204 |
| 4,618,944 | 10/1986 | Okajima | 365/204 |
| 4,692,638 | 9/1987 | Stiegler | 307/449 |
| 4,706,222 | 11/1987 | Kwiatkowski et al. | 307/463 |
| 4,798,977 | 1/1989 | Sakui et al. | 307/463 |
| 4,821,234 | 4/1989 | Nakasa | 365/204 |
| 4,891,793 | 1/1990 | Anumi | 365/225.6 |

FOREIGN PATENT DOCUMENTS

0337202A3 3/1989 European Pat. Off. .
0001885 1/1983 Japan .............................. 365/230.04
2117592 10/1983 United Kingdom .

OTHER PUBLICATIONS

Varadarajun, H. "Decoder for Ground-Up Array with STL-Compatible Output" IBM Technical Disclosure Bulletin vol. 20 No. 4 Sep. 1977.
Bordon, G. et al. "Top-Line Selection Circuit in a Memory Cell" IBM Technical Disclosure Bulletin vol. 20 No. 8 Jan. 1978.
IBM Technical Disclosure Bulletin, vol. 32, No. 2, Jul. 1989, pp. 272-274.
Homma et al., "A 35 ns, 2-W, 20-mm, 16-kbit ECL Bipolar RAM", IEEE Journal of Solid State Circuits, vol. SC-21, No. 5, Oct. 1986 pp. 675-680.

Primary Examiner—Joseph L. Dixon
Assistant Examiner—Jack A. Lane
Attorney, Agent, or Firm—Richard J. Paciulan; Denis G. Maloney

[57] ABSTRACT

A selection circuit for a bipolar ECL memory having memory cell connected to cell selection lines and, more particularly, to upper and lower wordlines. The circuit includes a line driver connected to the upper wordline, an input stage for controlling the line driver to activate the upper wordline connected thereto in response to an address signal, and a switching device responsive to the input stage for applying a discharging current to the lower word line to speed up deactivation of the memory cell in response to a change in the address signal. In one embodiment, the line driver is also turned on at an increased rate for a limited time following application of the address signal to speed up the activation of the line.

5 Claims, 3 Drawing Sheets

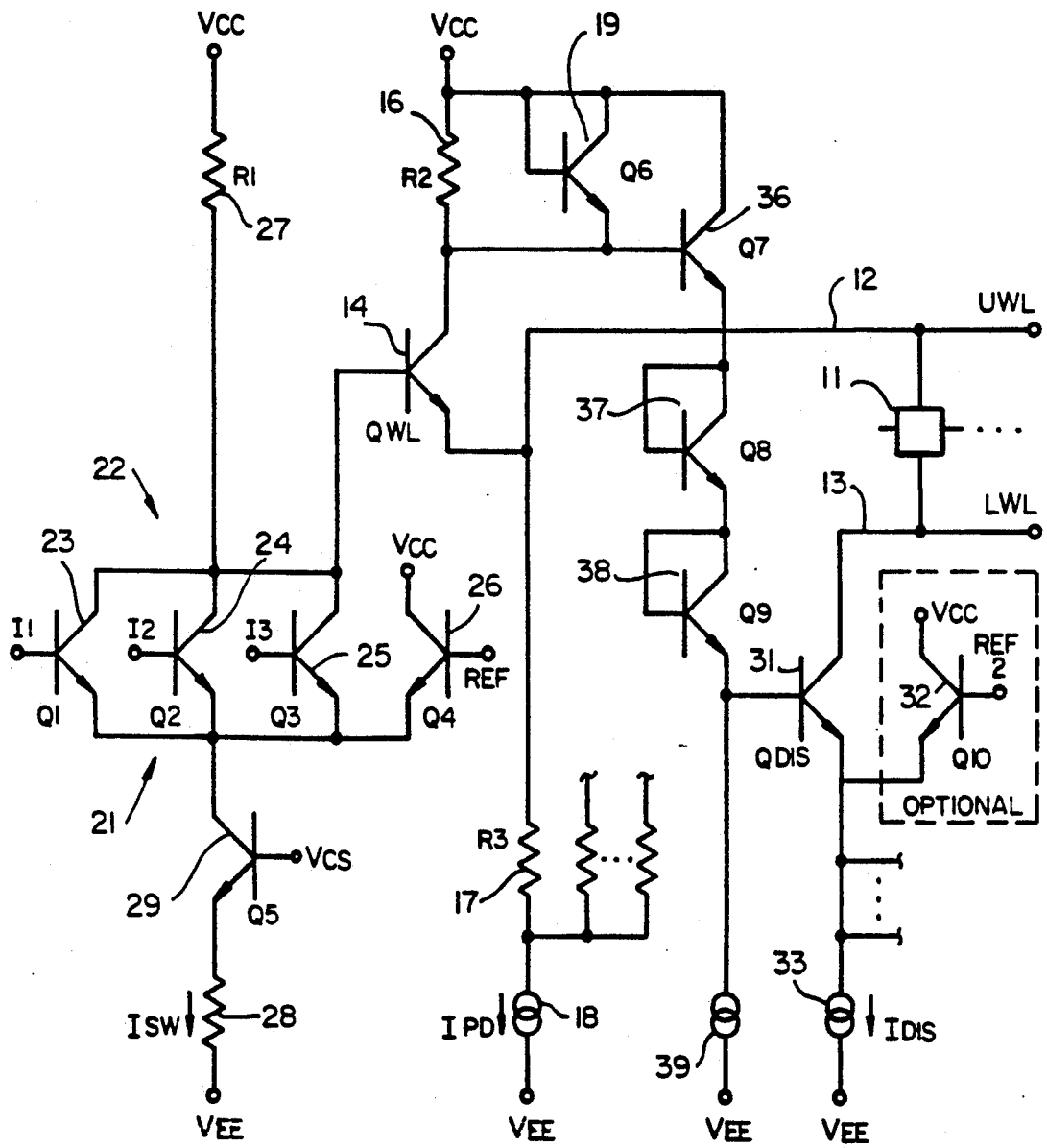
FIG_1

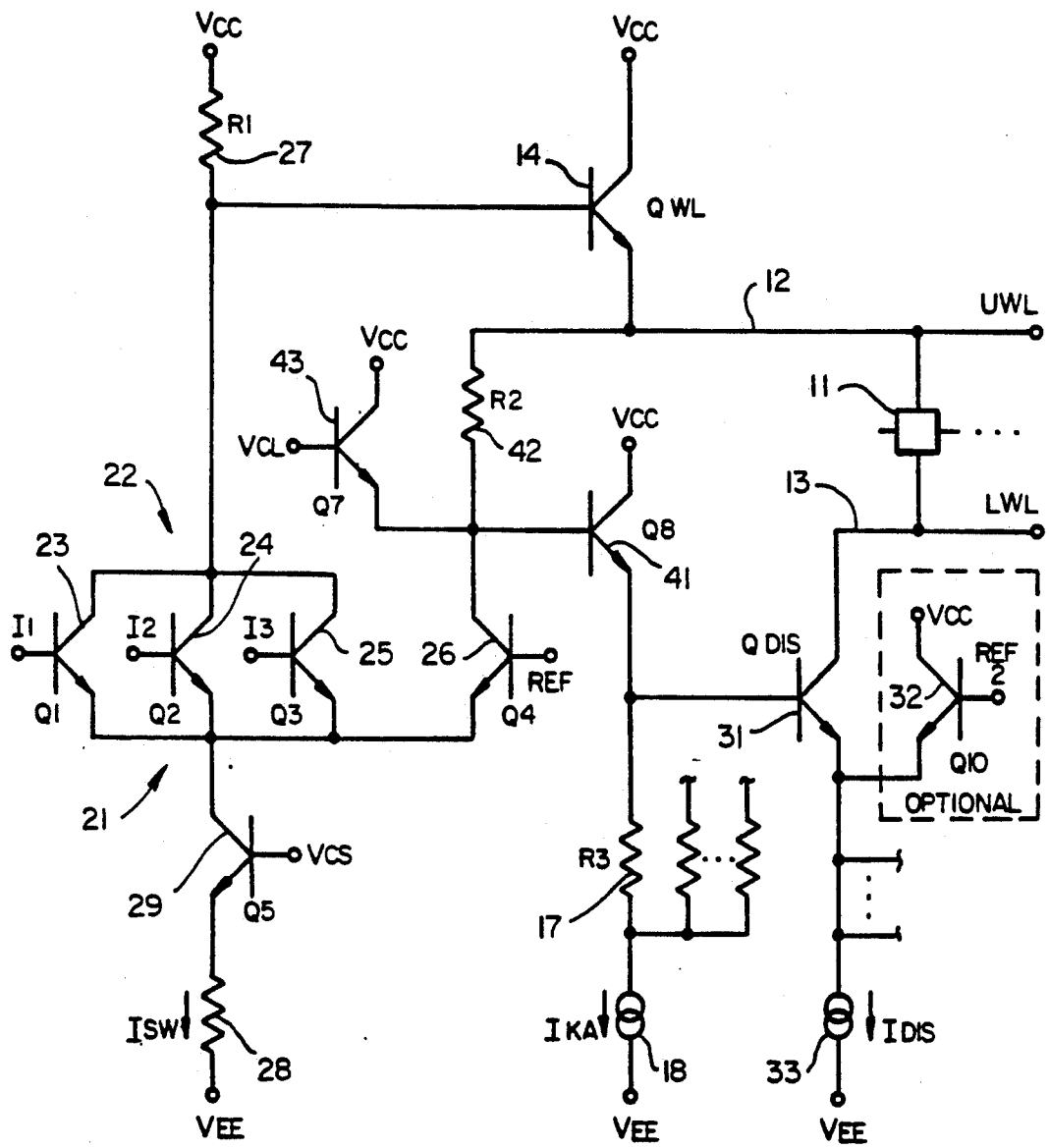
FIG_2

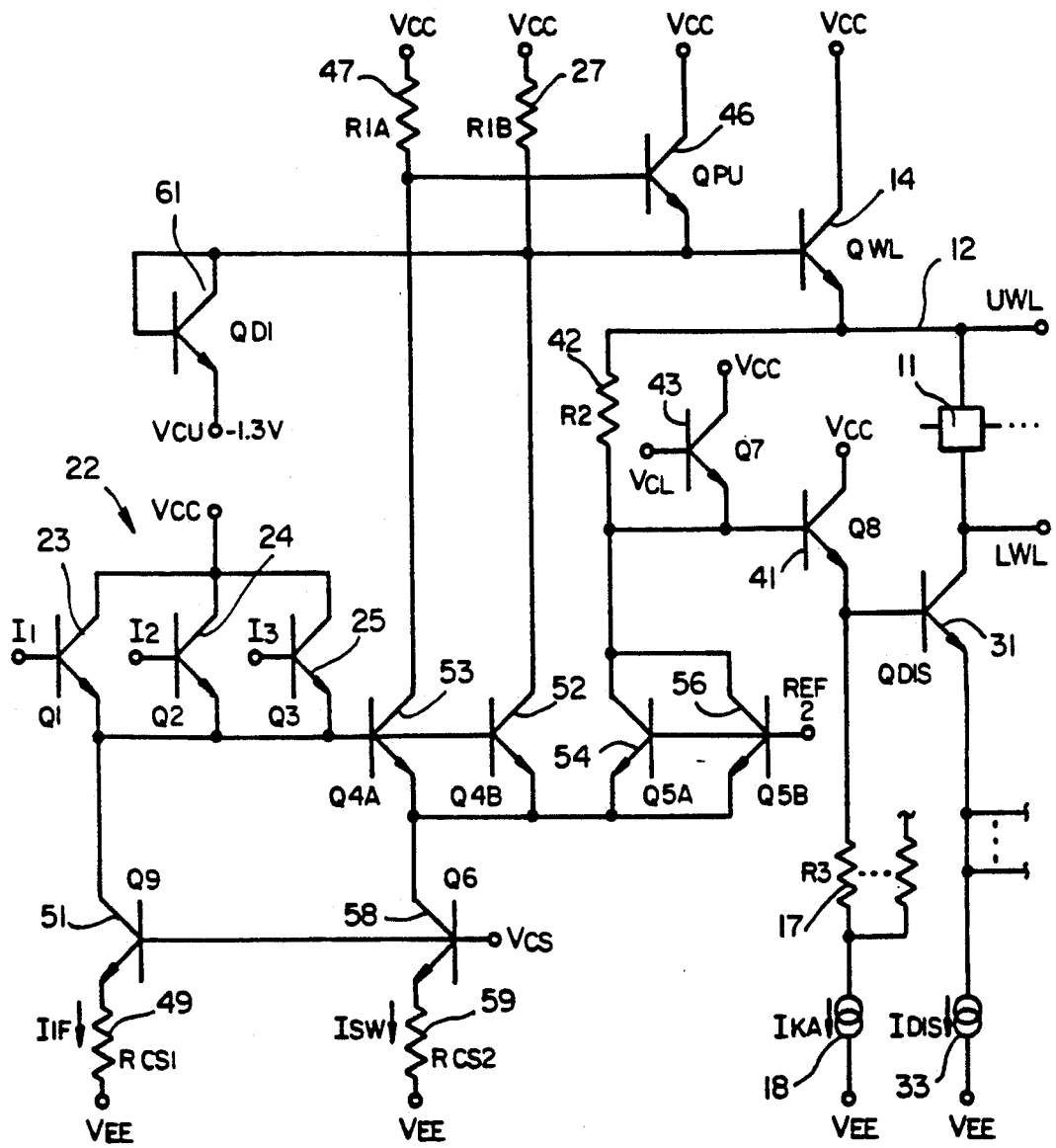
FIG_3

MEMORY SELECTION/DESELECTION CIRCUITRY HAVING A WORDLINE DISCHARGE CIRCUIT

This is a continuation of application Ser. No. 07/531,385 filed May 31, 1990 now abandoned.

BACKGROUND OF THE INVENTION

1. Field of the Invention

This invention pertains generally to memory devices for high speed digital computers and the like and, more particularly, to a circuit for the selection and deselection of cells in high-performance integrated circuit memories.

2. Description of Related Art

Semiconductor memory chips such as ECL (emitter coupled logic) bipolar memory chips generally have a relatively large number of memory cells which are organized into an array of bits (columns) and words (rows) in which individual ones of the cells can be addressed for the purpose of writing data thereto and reading data therefrom. A 16K bit random access memory, for example, might have 128 rows and 128 columns of memory cells, with all of the cells in a given row being connected to a single wordline and all of the cells in a given column being connected to a bitline pair.

The cells are connected to the respective lines in parallel, and this results in a relatively large capacitive load which can limit the performance of the memory. A line is generally selected and deselected by applying different voltage levels to it, and the capacitance and the magnitude of the voltage swing limit the speed at which the line can swing between the different voltage levels. This limits the rate at which data can be written and read since one cell must be completely deselected before another cell can be selected in order to have valid data.

In an ECL bipolar memory, the falling transition of the wordline is usually the dominant component of the delay, but the rising transition is also a factor. The faster a wordline is pulled down to its "low" potential (deselected state), the sooner another wordline can be selected and valid data written to or read from it.

SUMMARY OF THE INVENTION

The invention provides a selection circuit for a bipolar ECL memory having memory cells connected to cell selection lines, and more particularly, to upper and lower wordlines. The circuit includes a line driver connected to the upper wordline, an input stage for controlling the line driver to activate the upper wordline connected thereto in response to an address signal, controlled switching means for applying a discharging current to the lower wordline to speed up deactivation of the memory cell, and means forming part of the input stage for conditioning the controlled switching means to initiate application of the discharging current to the lower wordline in response to a change in the address signal. One embodiment also includes means for turning the line driver on at an increased level for a limited time following application of the address signal to speed up the activation of the line.

BRIEF DESCRIPTION OF THE DRAWINGS

FIG. 1 is a circuit diagram of one embodiment of a memory selection circuit.

FIG. 2 is a circuit diagram of another embodiment of a memory selection circuit according to the invention.

FIG. 3 is a circuit diagram of another embodiment of a memory selection circuit according to the invention.

DETAILED DESCRIPTION

In the drawings, the selection circuit is illustrated in connection with an ECL bipolar memory having a plurality of memory cells 11 connected between an upper wordline 12 and a lower wordline 13. The cells are also connected to bit lines which are omitted from the drawings for convenience of illustration.

In the embodiment of FIG. 1, the upper wordline is driven by a transistor 14 which has its emitter connected to the wordline and its collector connected to a voltage VCC by a resistor 16. "Keep-alive" current is supplied to the driver by a resistor 17 and a current source 18, which also provide an additional pull-down current during a falling transition on the wordline. Source 18 provides similar currents to driver transistors in other stages of the circuit through resistors similar to resistor 17. A clamping transistor 19 is connected to the collector of transistor 14 to prevent saturation of the driver transistor.

The driver transistor is controlled by a 3-input ECL NOR gate 21 which functions as an address decoder in an input stage 22. The gate comprises transistors 23–25 which form one half of an ECL pair, with an additional transistor 26 forming the other half of the pair. Input signals I1–I3 are applied to the bases of transistors 23–25, and a reference signal REF is applied to the base of transistor 26. The collectors of transistors 23–25 are connected to a voltage VCC by a resistor 27, current is supplied to the ECL pair through a resistor 28 and a transistor 29 connected to the emitters of the transistors.

As long as all of the input signals I1–I3 are "low", transistors 23–25 are turned off, and the voltage at the base of driver transistor 14 is at a level near VCC, which holds the driver "on" (i.e., a high output state) and the wordline connected to the driver in a selected state. If any one or more of the input signals is "high", the base of transistor 14 is pulled down, turning the driver "off" (i.e., to a low output state) and deselecting the wordline.

In order to increase the rate at which the wordline is discharged and thereby reduce the transition time between wordlines, a transistor 31 and a current source 33 are connected to the lower wordline 13 for supplying a discharge current to the line. If desired, a second transistor 32 can be connected to transistor 31 to form an ECL pair and carry the discharge current.

A transistor 36 is connected to the collector of driver transistor 14 for sensing a transition in the wordline. This transistor functions as an emitter follower, with its base connected to the collector of the driver and an additional pair of transistors 37, 38 connected in series between the emitter of sensing transistor 36 and the base of discharge transistor 31. These transistors provide three stages of ECL level shift, and "keep-alive" current for these transistors is provided by a source 39.

When a wordline transition begins, the voltage at the base of driver transistor 14 falls quickly, which tends to turn off the driver transistor, producing a transient loss of current through resistor 16. The voltage at the collector of transistor 14 increases by about 300 mV, and this pulse is transmitted by transistors 36–38 to the base of transistor 31. Since transistor 31 shares a large current source which is common to a number of memory cells, it turns on strongly in response to the 300 mV rise in its base-emitter voltage, thereby applying a pull-down, or discharge, current to the lower word line. When the emitter of transistor 14 is pulled low enough in response to the falling wordline, transistor 14 begins to conduct again, terminating the 300 mV pulse and shutting off the transient discharge current.

While this embodiment does provide some improvement in access speed by reducing the time required to discharge the wordline, it has certain shortcomings. Resistor 16 in the collector of the wordline driver tends to cause a slight forward bias on the driver transistor, which slows the response time of the device. The voltage at the collector of the driver changes rather slowly due to the relatively large transistor geometry which is necessary for the levels of current the transistor must handle. To minimize the current when the driver is in the "low" or deselected state, resistor 16 must have a relatively large value, which results in an undesirably large RC time constant at the collector of the driver. An additional delay is produced by the propagation of the signal through the three levels of shift provided by transistors 36–38 before transistor 31 starts conducting. The circuit also requires separate current sources to assure a proper level at the collector of the driver transistor when this transistor is "off" (i.e., in its low output state) and to supply the "keep-alive" current to the 3-stage level shifter formed by transistors 37–39. These additional sources result in an undesirably high power dissipation in the circuit.

The embodiment of FIG. 2 is similar to the embodiment of FIG. 1 in a number of respects, and like reference numerals designate corresponding elements in the two embodiments. The embodiment of FIG. 2 differs significantly, however, with respect to the way a wordline transition is detected and the way signals are applied to the discharge transistor.

In the embodiment of FIG. 2, the collector of transistor 26 on the right side of the ECL pair in the input stage is connected to the base of discharge transistor 31 through a single emitter follower 41. A resistor 42 is connected between the upper wordline 12 and the base of transistor 41, and a clamping transistor 43 is connected to the collector of transistor 26 to prevent saturation of this transistor.

As in the embodiment of FIG. 1, as long as all of the input signals I1-I3 are "low", transistors 23–25 all remain in an off state, and the base of driver transistor 14 is high, holding this transistor on and selecting the wordline driven by it.

If any of the input signals becomes high, current is steered to resistor 27, producing a voltage drop across this resistor which turns the driver transistor 14 "off" (i.e., to a low output state) and deselects the wordline connected to it. With the driver in its low output state, the voltage at the base of transistor 41 is approximately equal to the voltage on the upper wordline. This transistor receives a small keep-alive current from source 18 through resistor 17, and the voltage at the emitter of the transistor sets the voltage at the base of discharge transistor 31 such that the base-collector junction of the discharge transistor has a forward bias of about zero volts.

When a decoded address signal selects the wordline connected to driver 14, transistor 26 steers the current from the ECL pair to resistor 42, which maintains the discharge circuit in its off state by ensuring that the voltage at the base of transistor 41 is low. The base of transistor 41 remains low and thus prevents the high discharge current from reaching wordline 13 and loading down a rising (selecting) transition.

An important feature of the embodiment of FIG. 2 is once driver transistor 14 shuts off or switches to a low output state in a deselection step, the voltage at base of transistor 41 rises very quickly toward the level of wordline 12. The rising voltage turns on transistor 41, which then pulls up the base of discharge transistor 31. Resistor 17 functions as a bleeder resistor which provides current loading and allows the voltage at the emitter of transistor 41 to move freely without disturbing the voltage on the lower side of the resistor. The rising pulse at the base of transistor 31 causes all of the discharge current to flow through the lower wordline and begin to pull the wordline down. The large discharge current continues until the voltage at the collector of transistor 26 falls to the clamped level set by transistor 43, at which point the discharge current terminates.

In the embodiment of FIG. 2, the transition is detected in the input stage instead of the driver stage as it is in the embodiment of FIG. 1. Thus, the transition is detected a full stage earlier than it is in the previous embodiment. This means that the full discharge current is applied to the wordline sooner, which results in a shorter overall delay in the falling (deselecting) transition. In the rising (selecting) transition, the discharge current is prevented from reaching the wordline, which permits a relatively fast changing of the wordline. Moreover, in the steady state selected and deselected conditions, only a small portion of the discharge current reaches the lower wordline to satisfy set steady state voltage levels.

The embodiment of FIG. 2 thus has a number of important features and advantages. The deselection process is started sooner than in the previous embodiment, and the discharge current reaches the wordline about one stage of delay sooner. The self-terminating operation of the circuit provides a pulse width which is determined by the speed of the node being discharged. No oscillation occurs since the controlling pulse is coupled directly to the wordline. Transistor 41 provides additional gain which reduces the Miller effect associated with the discharge transistor and also provides level shifting to prevent saturation of the discharge transistor. The collector of the wordline driver transistor 14 is connected directly to the voltage VCC, which results in a further improvement in speed. This circuit has fewer transistors than the circuit of FIG. 1, and power dissipation is reduced by about 50 per cent due to the elimination of extra current sources.

The embodiment of FIG. 3 is similar to the embodiment of FIG. 2 in many respects, and like reference numerals designate corresponding elements in the two embodiments. In addition to improving the deselection process by speeding up the discharging of the wordline, the embodiment of FIG. 3 provides a further increase in wordline transition by speeding up the charging of the wordline during the selection process.

In the embodiment of FIG. 3, a pull-up transistor 46 is connected to driver transistor 14 to turn that transistor on more rapidly when the line connected to it is addressed. Transistor 46 is connected as an emitter follower, with its base connected to voltage VCC by a resistor 47, and its emitter connected to the base of the driver transistor.

In the input stage, transistors 23–25 are connected to perform an logic OR function, with the collectors of these transistors being connected directly to voltage VCC, and the emitters being connected to voltage VEE by a resistor 49 and a transistor 51.

The input stage also includes an ECL pair having transistors 52, 53 on one side thereof and transistors 54, 56 on the other. Current is supplied to the ECL pair by a transistor 58 and a resistor 59 connected to voltage VEE. The level of current supplied to the ECL pair is set by a control signal VCS applied to the base of transistor 58. This same signal is applied to the base of transistor 49 and controls the level of current through transistors 23–25. The output of the OR circuit is applied to the bases of transistor 52, 53, and a reference signal REF2 is applied to the bases of transistors 54, 56.

The collector of transistor 52 is connected to the base of driver transistor 14, and the collector of transistor 53 is connected to the base of pull-up transistor 46. The collectors of transistors 54, 56 are connected to the base of transistor 41 which controls the operation of discharge transistor 31 as in the embodiment of FIG. 2. Transistors 52, 53 thus control the operation of the driver transistor and the charging of the wordline, and transistors 54, 56 control the discharging of the wordline.

A clamping transistor 61 is connected to the emitter of pull-up transistor 46 to turn off the pull-up transistor and terminate the pull-up action when the voltage on the base of the driver transistor 14 reaches a sufficient level. In the embodiment illustrated, the emitter of the clamping transistor is connected to a voltage of $-1.3$ volts, and the clamping action occurs when the base of the driver reaches a level of about $-0.5$ volts.

When the input signals I1–I3 all become low, transistors 52, 53 turn off, and the bases of driver transistor 14 and pull-up transistor 46 both rise toward the level of voltage VCC. The pull-up transistor is thus turned on, providing a low impedance path between VCC and the base of the driver transistor, which raises the voltage at the base of the driver at a faster rate than it would with only a passive connection to the power source. With the base voltage rising faster, the driver turns on sooner and the selection process is completed more quickly than in the previous embodiments. As the voltage at the base of the driver continues to rise, it reaches a point where the base-collector junction of clamping transistor 61 will be forward biased, at which time the pull-up transistor turns off, terminating the charging effect at the base of the driver. Thus, the pull-up transistor provides an initial transient pulse of current at the outset of the selection process to drive the rising transition at a faster rate than if it were pulled up only by a passive resistor. Once the pull-up transistor is turned off, the driver is held on by the voltage applied to it by resistor 27 until a new address is decoded by the OR circuit.

As soon as one of the input signals I1–I3 goes high, transistors 52, 53 are turned on, pulling down the bases of driver transistor 14 and pull-up transistor 46, switching the driver to its low output state to initiate the deselection process. At the same time, transistors 54, 56 are turned off, allowing the voltage at the base of transistor 41 to rise quickly toward the level of the upper wordline. initiating the pulse for discharging the wordline as in the embodiment of FIG. 2.

The embodiment of FIG. 3 has the advantages of the embodiment of FIG. 2 from the standpoint of providing a relatively fast discharge of a deselected word line. In addition, it starts the selection process more quickly, and the faster rising transition allows the newly selected wordline to reach its high state more quickly, thereby improving access time even further.

It is apparent from the foregoing that a new and improved memory selection circuit has been provided. While only certain presently preferred embodiments have been described in detail, as will be apparent to those familiar with the art, certain changes and modifications can be made without departing from the scope of the invention as defined by the following claims.

We claim:

1. In a wordline selection circuit for a bipolar ECL memory having a plurality of memory cells connected between upper and lower wordlines: an ECL input stage having a plurality of transistors forming a NOR gate decoder responsive to an address signal and an additional transistor forming an ECL pair with the transistors in the decoder, a driver transistor having its emitter connected to the upper wordline and its base connected to the decoder, a resistor connected between a voltage source and the base of the driver transistor, a current source, a switching transistor connected between the lower wordline and the current source, an emitter follower transistor connected between the collector of the additional transistor in the ECL pair and the base of the switching transistor, and a resistor connected between the upper wordline and the collector of the additional transistor in the ECL pair.

2. In a wordline selection circuit for a bipolar ECL memory having a plurality of memory cells connected between upper and lower wordlines: an ECL input stage having first and second transistors with their bases and emitters connected together forming one side of an ECL pair, means connected to the bases of the first and second transistors and responsive to an address signal for controlling the state of the ECL pair in accordance with the address signal, a driver transistor having its emitter connected to the upper wordline and its base connected to the first transistor in the ECL pair, a pull-up transistor having its emitter connected to the base of the driver transistor and its base connected to the second transistor in the ECL pair, resistors connected between a voltage source and the bases of the pull-up transistor and the driver transistor, and a clamping transistor connected to the emitter of the pull-up transistor and the base of the driver transistor for turning off the pull-up transistor when the voltage at the base of the driver transistor is above a predetermined level.

3. In a wordline selection circuit for a bipolar ECL memory having a plurality of memory cells connected between upper and lower wordlines: an ECL input stage having first and second transistors with their bases and emitters connected together forming one side of an ECL pair and third and fourth transistors connected in parallel forming the other side of the ECL pair, means connected to the bases of the first and second transistors and responsive to an address signal for controlling the state of the ECL pair in accordance with the address signal, a driver transistor having its emitter connected to the upper wordline and its base connected to the first transistor in the ECL pair, a pull-up transistor having its emitter connected to the base of the driver transistor and its base connected to the second transistor in the ECL pair, resistors connected between a voltage source and the bases of the pull-up transistor and the driver transistor, a clamping transistor connected to the emitter of the pull-up transistor and the base of the driver transistor for turning off the pull-up transistor when the voltage at the base of the driver transistor is above a predetermined level, a current source, a switching transistor connected between the lower wordline and the current source, an emitter follower transistor connected between the collectors of the third and fourth transistors in the ECL pair and the base of the switching transistor, and a resistor connected between the upper wordline and the collector of the third and fourth transistors in the ECL pair.

4. The circuit of claim 3 wherein the means responsive to the address signals comprises a plurality of transistors connected as an ECL NOR gate.

5. In a wordline selection circuit for a bipolar ECL memory having a plurality of memory cells connected between upper and lower wordlines: an ECL input stage having a plurality of transistors forming a decoder responsive to an address signal and an additional transistor forming an ECL pair with the transistors in the decoder, a driver transistor having its emitter connected to the upper wordline and its base connected to the decoder, a current source, a switching transistor connected between the lower wordline and the current source, an emitter follower transistor having its base connected to the collector of the additional transistor in the ECL pair and its emitter connected to the base of the switching transistor, and a resistor connected between the upper wordline and the base of emitter follower transistor.

* * * * *